United States Patent [19]

Masumoto et al.

[11] Patent Number: 5,100,869
[45] Date of Patent: Mar. 31, 1992

[54] PROCESS FOR PRODUCING METAL OXIDE-TYPE SUPERCONDUCTIVE MATERIAL

[75] Inventors: Tsuyoshi Masumoto; Akihisa Inoue; Kunio Matsuzaki, all of Sendai; Keiji Moroishi, Akishima, all of Japan

[73] Assignees: Tsuyoshi Masumoto, Miyagi; Hoya Corporation, Tokyo, both of Japan

[21] Appl. No.: 322,156

[22] Filed: Mar. 10, 1989

[30] Foreign Application Priority Data

Mar. 14, 1988 [JP] Japan ............................. 63-59815

[51] Int. Cl.⁵ ........................................... H01L 39/12
[52] U.S. Cl. ........................................ 505/1; 75/234;
    505/805; 505/807; 505/813; 419/19; 419/23;
    419/33; 148/11.5 C; 148/11.5 P
[58] Field of Search ............... 75/234; 505/805, 807,
    505/813, 1; 419/32, 23, 19; 148/11.5 C, 11.5 P

[56] References Cited

U.S. PATENT DOCUMENTS

| | | | |
|---|---|---|---|
| 4,624,705 | 11/1986 | Jatkar et al. | 75/239 |
| 4,668,470 | 5/1987 | Gilman et al. | 419/32 |
| 4,892,861 | 1/1990 | Ray | 505/1 |
| 4,929,596 | 5/1990 | Meyer et al. | 505/1 |
| 4,962,084 | 10/1990 | de Barbadillo et al. | 505/1 |
| 4,962,085 | 10/1990 | de Barbadillo, II et al. | 505/1 |
| 4,983,574 | 1/1991 | Meyer | 505/1 |
| 4,999,336 | 3/1991 | Nadkarni et al. | 505/1 |
| 5,034,373 | 7/1991 | Smith et al. | 505/1 |
| 5,043,320 | 9/1991 | Meyer et al. | 505/1 |

OTHER PUBLICATIONS

Preparation of a High Tc Superconductor by Oxidation of an Amorphous LaSrCu Alloy R,BBON in Air. Japanese Journal Applied Physics, vol. 26, No. 4, 1987.

*Primary Examiner*—Stephen J. Lechert, Jr.
*Assistant Examiner*—N. Bhat
*Attorney, Agent, or Firm*—Nixon & Vanderhye

[57] ABSTRACT

A metal oxide-type superconductive material is produced by a process which comprises a first step of subjecting a powder raw material containing given proportions of metal elements to be contained in said metal oxide-type superconductive material, to mechanical grinding and alloying simultaneously to obtain an alloy powder and a second step of heat-treating the alloy powder in an oxygen-containing gas atmosphere to obtain a metal oxide.

The superconductive material obtained has a high density, a low porosity, a high strength and a high critical current density.

5 Claims, 1 Drawing Sheet

PROCESS FOR PRODUCING METAL OXIDE-TYPE SUPERCONDUCTIVE MATERIAL

BACKGROUND OF THE INVENTION

1. Field of the Invention

The present invention relates to a process for producing a metal oxide-type superconductive material. More particularly, the present invention relates to a process for producing a metal oxide-type superconductive material which is suitable for use in various products utilizing superconductivity because said superconductive material has a high critical current density. The metal oxide-type superconductive material obtained by the present invention is used as a material for superconductive magnet, superconductive generator, electric storage system, electric transmission system, Josephson device, sensor device, small-sized generator, small-sized cell or battery, etc.

2. Description of the Prior Art

Metal oxide-type superconductive materials are a new high temperature superconductive material which was first reported in April, 1986 by Zurich Research Institute of IBM. Since then, vigorous researches have been made on these superconductive materials in various countries. Rare earth metal-containing metal oxides represented by Y-Ba-Cu-O systems are drawing special attention as a high temperature superconductive material having a critical transition temperature (Tc) of 77 K (a boiling point of nitrogen) or higher. Further, it has been known recently that Bi-Sr-Ca-Cu-O systems and Tl-Ca-Ba-Cu-O systems both containing no rare earth element give similar Tc's.

These superconductive materials of rare earth element-containing metal oxide type are ordinarily obtained by a process comprising synthesizing metal oxide powders by a wet or dry method, sintering the pressurized powders to obtain a molded sintered material, and heat-treating the material at about 900°–950° C. followed by slow cooling.

There is also known a process for producing a metal oxide which comprises compounding metals as starting materials, melting them to obtain an alloy, and subjecting the alloy to an oxidation treatment.

In the former process wherein the metal oxide powders produced from synthesis by a wet or dry method are sintered, the resulting metal oxide-type superconductive material is inevitably a sintered metal oxide material and accordingly has problems of, for example, (1) having a low strength and being very fragile, (2) having a low packing density and containing a lot of pores and accoridngly causing deterioration of properties in the air, and (3) having a low critical current density (a low Jc).

In the latter process wherein a molten alloy is oxidized, many rare earth elements such as Y, Er, Gd and the like tend to cause phase separation when melted with Ba and are difficult to form a uniform mixture with Ba; therefore, the process is applicable only to the production of a Eu-Ba-Cu-O system or an Yb-Ba-Cu-O system wherein the raw material metals are easily miscible with each other when melted.

The present invention has been made in order to solve the above mentioned problems of the prior art.

An object of the present invention is to provide a novel process for producing a novel metal oxide-type superconductive material, which enables (1) the use of rare earth elements other than Eu and Yb, (2) the obtainment of a superconductive material having a low porosity and a high density, and (3) the obtainment of a superconductive material having a high Jc.

Other objects of the present invention will be apparent from the following description.

SUMMARY OF THE INVENTION

The present invention has been made to attain the above objects. The present invention lies in a process for producing a metal oxide-type superconductive material, which comprises a first step of subjecting a powder raw material containing given proportions of metal elements to be contained in said metal oxide-type superconductive material, to mechanical grinding and alloying simultaneously to obtain an alloy powder and a second step of heat-treating the alloy powder in an oxygen-containing gas atmosphere to obtain a metal oxide.

DETAILED DESCRIPTION OF THE INVENTION

Figure 1:
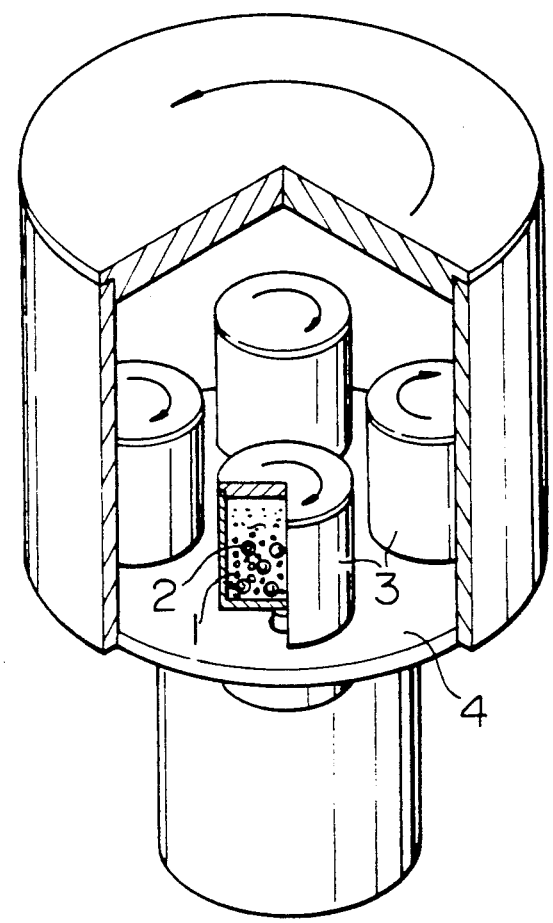
FIG. 1 is a schematic drawing showing a planetary ball mill which is preferably used for the production of an alloy powder in the process of the present invention.

To begin with, the first step in the process of the present invention is described. The first step is, as mentioned above, a step of subjecting a powder raw material containing given proportions of metal elements to be contained in an objective metal oxide-type superconductive material, to mechanical grinding and alloying simultaneously to obtain an alloy powder. In this step, the powder raw material containing given proportions of metal elements can be a powder mixture consisting of the metal elements constituting a metal oxide as an objective compound of the present invention, or a powder mixture consisting of (a) an alloy powder produced by arc-melting or the like and (b) a powder of metal elements which cannot be alloyed with each other (accordingly this latter powder mixture partially contains an alloy powder). The powder raw material consisting of a metal mixture is subjected to mechanical grinding and alloying simultaneously. The mechanical grinding and alloying are effected by the use of, for example, an apparatus shown in FIG. 1 or FIG. 2. When a planetary ball mill shown in FIG. 1 is used, a metal mixture 1 and copper balls 2 are placed in copper pots 3; the copper pots 3 are provided on a turn table 4; the pots 3 and the turn table 4 are rotated in opposite directions; thereby, the metal mixture can be subjected to grinding and alloying. That is, in using the planetary ball mill of FIG. 1, the powder raw material 1 contained in the copper pots 3 rotating in a direction opposite to that of the turn table 4 is mechanically ground by the irregular movement of the copper balls 2 also contained in the copper pots 3 and simultaneously alloyed by the mechanical force of the movement. In order to prevent the contamination of an objective alloy by an element which should not be present in the alloy, it is preferable that the pots and the balls of the ball mill be made of metallic copper. In order to prevent the oxidation of raw material metals, it is also preferable that the atmosphere in the pots be an inert gas atmosphere such as argon, nitgrogen or the like, or the grinding be effected in alcohol or acetone.

Figure 2:
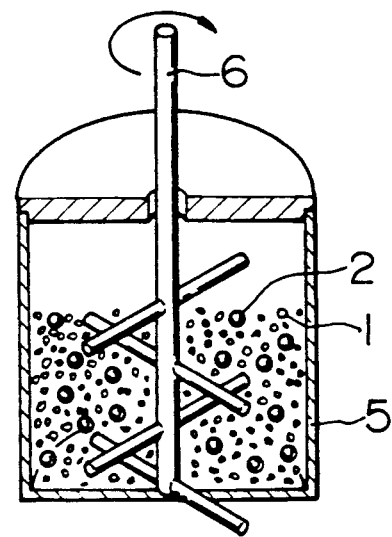
FIG. 2 is a schematic drawing showing an attritor which is preferably used for the production of an alloy powder in the process of the present invention.

When an attritor shown in FIG. 2 is used, a metal mixture 1 and copper balls 2 are placed in a container 5; a rotor 6 provided to the container 5 is rotated; thereby, the metal mixture 1 is finely ground to obtain an alloy powder. That is, in using the attritor of FIG. 2, the powder raw material is mechanically ground by (a) the rotation of the rotor 6 and (b) the irregular movement of the copper balls 2 in the container 5, and simultaneously alloyed by these mechanical forces.

Needless to say, there can be used any apparatus other than those shown in FIGS. 1 and 2, as long as it can conduct the grinding and alloying of the metal mixture.

The alloy powder obtained by the above mechanical alloying is (i) an amorphous solid or (ii) a crystalline solid solution of single phase. The above first step enables the use of rare earth elements immiscible with Ba (e.g. Y, Gd, Er) and yet can obtain a uniform alloy powder.

Next, the second step in the process of the present invention is described. The second step is a step of heat-treating the alloy powder obtained in the first step, in an oxygen-containing gas atmosphere to convert the metal elements in the alloy powder into a metal oxide. In this case, the alloy powder preferably has particle sizes of 5 $\mu$m or less but large enough to cause no abrupt oxidation, because too large particle sizes give an oxide having large crystal grain sizes and accordingly a low Jc. The oxygen-containing gas atmosphere consists of air, oxygen or a mixed gas containing oxygen of given partial pressure (e.g. about 0.1-1 Torr) and other gas (e.g. at least one gas selected from argon, helium and nitrogen). The type and composition of the atmosphere is determined so that a metal oxide of desired properties can be obtained. Oxygen is necessary in order to oxidize the metal elements in the alloy powder obtained in the first step and to convert them into an oxide. The temperature elevation rate, temperature and time required to heat-treat the metal elements in the atmosphere to obtain an oxide are appropriately determined depending upon the type of the atmosphere and the types of the metals.

It is possible that prior to the heat treatment in the oxygen-containing atmosphere, the alloy powder be made into a molded product by means of pressure molding or the like.

Conventional high temperature superconductive metal oxides obtained by sintering of metal oxide are provided always as a material of low Jc, because it is non-uniform, has a low denisty and contains a lot of pores. In contrast, the process of the present invention can provide a superconductive metal oxide of high density, low porosity and improved Jc.

As described above, the process of the present invention comprises a first step of subjecting a powder raw material containing given proportions of metal elements, to mechanical grinding and alloying simultaneously to obtain an alloy powder and a second step of oxidizing the alloy powder. In the first step, a powder raw material consisting of a metal mixture is ground mechanically and simultaneously alloyed by the mechanical force and thereby converted into a uniform alloy powder; in the second step, the uniform alloy powder is oxidized in a precisely controlled, oxygen-containing atmosphere; thereby, a dense, uniform metal oxide-type superconductive material can be produced at a high reliability.

The present invention is described in more detail below by way of Examples.

EXAMPLE 1

A metal oxide-type superconductive material having a composition of $Y_1Ba_2Cu_3O_y$ (y is a value ranging from 6.5 to 6.9) was produced by the use of a planetary ball mill shown in FIG. 1 and according to the following procedure. As the starting materials, there were used an alloy powder having a composition of $Y_{80}Cu_{20}$ (particle sizes: about 0.1 mm) produced by arc-melting, a Ba powder (particle sizes: less than 1 mm) and a Cu powder (particle sizes: less than 40 $\mu$m). These three powders were compounded so as to give an atomic ratio of 1 (Y): 2 (Ba):3 (Cu), to obtain a powder mixture. This powder mixture 1 and copper balls 2 were placed in copper pots 3 of a FIG. 1 apparatus at a weight ratio of 1:20, and the inside of each pot was filled with argon. Then, each pot was provided on a turn table 4 and the pots 3 and the turn table 4 were rotated in opposite directions for 48 hours to obtain an alloy powder having a composition of $Y_1Ba_2Cu_3$ and particle sizes of 5 $\mu$m or less.

The alloy powder was then pressure-molded at a load of 3,000 kgf/cm$^2$ into a disc having a diameter of 10 mm and a thickness of 1 mm. This molded alloy product was heated at 920° C. for 24 hours in an oxygen atmosphere to obtain a metal oxide. Upon observation through an optical microscope, the metal oxide had a structure in which fine crystal grains of 5 $\mu$m in size were packed densely. Further, an X-ray analysis indicated that the metal oxide was an orthorhombic oxygen defected perovskite-type oxide. The metal oxide was measured for electric resistance from 77 K to room temperature by the DC four probe method, which indicated that the metal oxide was a superconductive material having a critical transition temperature of 92 K (onset), 91 K (mid point) and 88 K (zero resistance). The metal oxide was further measured for critical current density (Jc) at 77 K by the same DC four probe method, which was 110 A/cm$^2$. This Jc value was several times as high as the Jc values (about 20 A/cm$^2$) of ordinary superconductive materials obtained by sintering metal oxides.

EXAMPLES 2-6

Various superconductive materials were produced in the same procedure as in Example 1 except that starting materials different from those of Example 1 were compounded so as to give an atomic ratio of 1 (Y, Gd, Er or Ho):2 (Ba):3 (Cu) and heat treatment conditions different from those of Example 1 were employed in Example 5. These superconductive materials were measured for Tc and Jc. The results are shown in Table 1, together with the results of Example 1. As is clear from Table 1, Examples 2-6 gave metal oxide-type superconductive materials having a high Tc and a high Jc. Especially those of Examples 4 and 6 have a Tc of about 90 K and a Jc of about 100 A/cm$^2$.

In these Examples, there was used, as a rare earth element, Y, Gd, Er or Ho. As a matter of course, the process of the present invention can be applied to a case using other rare earth element.

TABLE 1

Critical transition temperatures (Tc) and critical current densities (Jc) of metal oxide-type superconductive materials

| Example | Starting materials | Heat treatment conditions | Tc (K) Onset | Tc (K) Zero resistance | Jc (A/cm$^2$) |
| --- | --- | --- | --- | --- | --- |
| 1 | Y$_{80}$Cu$_{20}$, Ba and Cu | In oxygen, 920° C. × 24 hr | 92 | 88 | 110 |
| 2 | Y$_{80}$Cu$_{20}$, BaCu and Cu | In oxygen, 920° C. × 24 hr | 92 | 87 | 90 |
| 3 | Gd$_{80}$Cu$_{20}$, Ba and Cu | In oxygen, 920° C. × 24 hr | 86 | 78 | 70 |
| 4 | Gd$_{80}$Cu$_{20}$, BaCu and Cu | In oxygen, 920° C. × 24 hr | 92 | 87 | 100 |
| 5 | Er$_{80}$Cu$_{20}$, BaCu and Cu | In air, 920° C. × 24 hr | 90 | 82 | 80 |
| 6 | Ho$_{80}$Cu$_{20}$, BaCu and Cu | In oxygen, 920° C. × 24 hr | 92 | 86 | 100 |

EXAMPLE 7

A metal oxide-type superconductive material having a composition of Bi$_1$Sr$_1$Ca$_1$Cu$_2$O$_y$ (y is a value ranging from 5.3 to 5.7) was produced by the use of a planetary ball mill shown in FIG. 1 and according to the following procedure. As the starting materials, there were used an alloy powder having a composition of Bi$_1$Sr$_1$Ca$_1$ (particle sizes: about 0.1 mm) produced by arc-melting and a Cu powder (particle sizes: less than 40 μm). These two powders were compounded so as to give an atomic ratio of 1 (Bi):1 (Sr):1 (Ca):2 (Cu) to obtain a powder mixture. This powder mixture was made into an alloy powder using the apparatus of FIG. 1 and accoridng to the same procedure as in Example 1. The alloy powder obtained after 48 hours of rotation was a solid solution of face-centered cubic structure and particle sizes of 5 μm or less.

The alloy powder was then pressure-molded at a load of 2,500 kgf/cm$^2$ into a disc having a diameter of 10 mm and a thickness of 1 mm. The molded alloy product was heat-treated at 850° C. for 24 hours in the air to obtain a metal oxide. The metal oxide began to show a decrease in electric resistance at about 110 K and showed a zero resistance at about 95 K. The Jc at zero magnetic field of the metal oxide was as high as about 550 A/cm$^2$. Therefore, the procedure of this Example was effective for obtaining a superconductive material with improved Jc.

Thus, in the present invention, by employing a means of mechanical alloying, it has become possible to obtain a uniform alloy from metal elements which have hitherto been immiscible with each other and by subjecting the alloy to an oxidation treatment, it has become possible to produce a metal oxide-type superconduitve material having a high denisty, a low porosity, a high strength and a high critical current density (a high Jc).

What is claimed is:

1. A process for producing a metal oxide-type superconductive material, which comprises
    (a) subjecting a powder raw material, containing predetermined proportions of metal elements to be contained in said metal oxide-type superconductive material, to mechanical grinding and alloying simultaneously to obtain an alloy powder having a particle size of at most 5 μm, and thereafter
    (b) heat-treating the alloy powder in an oxygen-containing gas atmosphere to obtain a metal oxide.

2. A process for producing a metal oxide-type superconductive material according to claim 1, wherein the powder raw material is a powder mixture consisting of the metal elements or a powder mixture consisting of an alloy powder and a metal element powder.

3. A process for producing a metal oxide-type superconductive material according to claim 1, wherein the mechanical grinding and alloying is effected with a planetary ball mill or an attritor.

4. A process for producing a metal oxide-type superconductive material according to claim 1, wherein prior to conducting the step (b), the alloy powder is made into a molded product.

5. A metal oxide-type superconductive material produced by a process according to any one of claims 1, 2, 3 or 4.

* * * * *